United States Patent
Katayama et al.

(10) Patent No.: US 8,908,446 B2
(45) Date of Patent: Dec. 9, 2014

(54) SEMICONDUCTOR DEVICE AND METHOD OF DRIVING THEREOF

(75) Inventors: Akira Katayama, Kagawa-ken (JP); Katsuhiko Hoya, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 216 days.

(21) Appl. No.: 13/607,689

(22) Filed: Sep. 8, 2012

(65) Prior Publication Data

US 2013/0258787 A1    Oct. 3, 2013

(30) Foreign Application Priority Data

Mar. 27, 2012   (JP) ................... P2012-072281

(51) Int. Cl.
*G11C 16/04*    (2006.01)
*G11C 7/10*    (2006.01)

(52) U.S. Cl.
CPC ............. *G11C 7/10* (2013.01); *G11C 7/1093* (2013.01); *G11C 7/1087* (2013.01); *G11C 7/1012* (2013.01)
USPC .................................... 365/189.05; 365/193

(58) Field of Classification Search
CPC .. G11C 7/1087; G11C 11/4076; G11C 7/109; G11C 7/106
USPC ........................... 365/189.05, 193
See application file for complete search history.

(56) References Cited

U.S. PATENT DOCUMENTS

| 6,125,078 | A | 9/2000 | Ooishi |
| 6,295,245 | B1 | 9/2001 | Tomita |
| 2002/0118575 | A1* | 8/2002 | Sonoda et al. ........... 365/189.05 |
| 2006/0268652 | A1* | 11/2006 | Jeong ...................... 365/230.06 |

FOREIGN PATENT DOCUMENTS

| JP | H03-049699 U | 5/1991 |
| JP | 2000-222877 | 8/2000 |
| JP | 2003-243991 A | 8/2003 |
| JP | 2004-362756 A | 12/2004 |

OTHER PUBLICATIONS

Office Action mailed Jul. 25, 2014 in counterpart Japanese Application 2012-07228 with English translation.

* cited by examiner

*Primary Examiner* — Tuan T Nguyen
(74) *Attorney, Agent, or Firm* — Patterson & Sheridan, LLP

(57) ABSTRACT

A semiconductor device includes a first latch unit that latches write data based on a strobe signal, a second latch unit that receives the write data latched in the first latch unit based on a first clock signal, and a strobe generation unit that generates the strobe signal and supplies it to the first latch unit. The strobe generation unit includes a bit shift counter, which receives a second clock signal and outputs a bit shift signal having a logic level that is inverted every plural clock cycles of the second clock signal, and a logic gate that outputs the second clock signal as the strobe signal according to the bit shift signal. The latch period of the write data in the first latch part is determined by the period of the strobe signal and also the period of the bit shift signal.

20 Claims, 8 Drawing Sheets

SEMICONDUCTOR DEVICE AND METHOD OF DRIVING THEREOF

CROSS-REFERENCE TO RELATED APPLICATION

This application is based upon and claims the benefit of priority from Japanese Patent Application No. 2012-072281, filed Mar. 27, 2012; the entire contents of which are incorporated herein by reference.

FIELD

Embodiments described herein relate generally to a semiconductor device and a method of driving embodiment a semiconductor device.

BACKGROUND

There are semiconductor devices whose input/output circuit (I/O circuit) has a DDR (double data rate) function. The I/O circuit having the DDR function receives commands at a timing of clock CK_t and clock CK_c in a read operation or a write operation and receives write data at a timing of clock DQS_t and clock DQS_c. The consumed power in such a design and inferior data writes that are caused by the shifting of the timing of the clocks have been problems.

DETAILED DESCRIPTION

In general, embodiments will be explained with reference to the figures. The particular description of the embodiments should not limit the scope of the invention. The semiconductor device, according to one embodiment, is provided with a first latch unit that latches write data received from an outside source based on a strobe signal that enables latching of the write data, a second latch unit that receives the write data latched in the first latch unit based on a first clock signal and latches the write data to transfer the data to a buffer, and a strobe generation unit that generates the strobe signal and supplies the strobe signal to the first latch unit. The strobe generation unit is provided with a bit shift counter, which receives a second clock signal and outputs a bit shift signal whose logic is inverted every n clock cycles (n represents an integer of 2 or greater) of the second clock signal, and a logic gate that outputs the second clock signal as the strobe signal at each half-period of the bit shift signal. The latch period of the write data in the first latch unit is determined by the period of the strobe signal, as well as the length of the half-period of the bit shift signal.

According to the embodiment, there are provided a semiconductor device and its driving method, which can reduce the consumed power by a tree part for transmitting clock signals and also increase the quality of data writes, even if the timing of the clock signals is shifted to some degree.

This embodiment can be applied to all semiconductor devices having a DDR function in an I/O circuit. For example, this embodiment can also be applied to semiconductor storage devices such as flash EEPROM, MRAM, PCRAM, and ReRAM. Next, an embodiment applied to magneto-resistive random access memory (MRAM) will be explained.

First Embodiment

Figure 1:
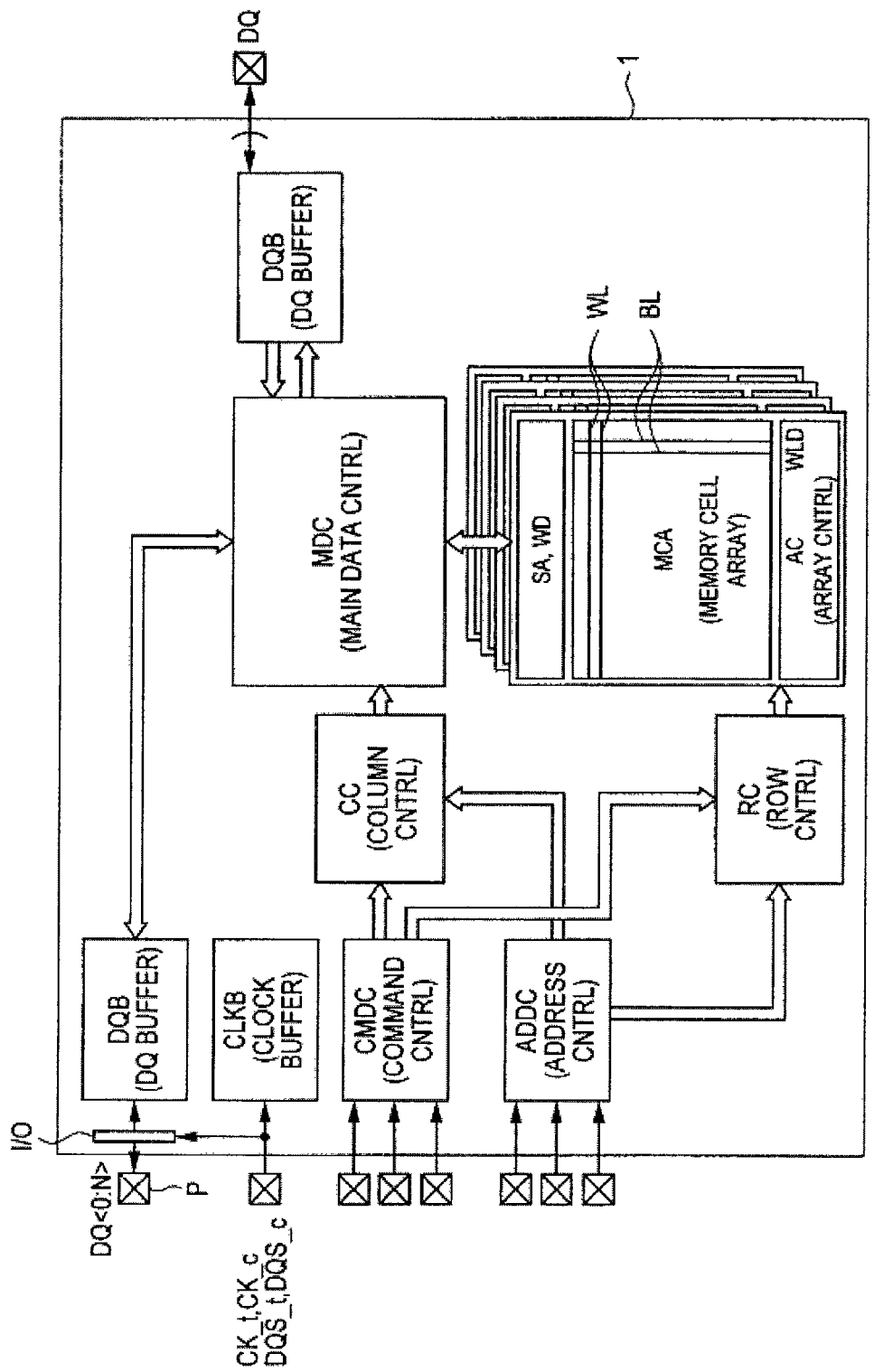
FIG. 1 is a block diagram of a semiconductor device according to a first embodiment.

FIG. 1 is a block diagram showing a memory chip 1 of a MRAM according to a first embodiment. The memory chip 1 is provided with a memory cell array MCA, sense amplifier SA, main data controller MDC, DQ buffer DQB, column controller CC, row controller RC, clock buffer CLKB, command controller CMDC, address controller ADDC, and array controller AC.

The memory cell array MCA, for example, is provided with plural memory cells two-dimensionally arranged in a matrix form. Each memory cell, for example, is arranged at the intersections of bit lines BL and word lines WL as viewed from above. The bit lines BL are orthogonal to the word lines WL.

The sense amplifier SA, for example, is connected to memory cells via the bit lines BL and has the function of detecting data of the memory cells. A write driver WD, for example, is connected to the memory cells via the bit lines BL and has the function of writing data into the memory cells.

The main data controller MDC transfers the data received from the DQ buffer DQB to the write driver WD under the control of the column controller CC so that the data are written into the desired column or transfers the data read out from the desired column to the DQ buffer DQB under the control of the column controller CC.

The DQ buffer DQB temporarily stores the read data detected by the sense amplifier SA and outputs the readout data to the outside of the memory chip 1. Alternatively, the DQ buffer DQB temporarily holds the write data received from outside of the memory chip 1 via the DQ pad DQ and transfers the write data to the write driver WD.

The column controller CC operates the sense amplifier SA or write driver WD according to the column address so that the bit line BL of the desired column is selectively driven. The row controller RC operates a word line driver WLD according to a row address so that the desired word line WL is selectively driven. The clock buffer CLKB inputs a clock signal for determining the timing of the entire operation of the memory chip 1.

The command controller CMDC receives commands showing various kinds of operations, such as a read operation, a write operation, and an erase operation and controls the column controller CC and the row controller RC according to these commands. The address controller ADDC receives row addresses and column addresses, decodes these addresses, and sends these addresses to the column controller CC and the row controller RC. The array controller AC controls the memory cell array MCA. The address controller ADDC may send other addresses which correspond to row addresses and column addresses.

An I/O interface is installed between a pad P and the data buffer DQB, transfers write data to the data buffer DQB from the pad P based on clock signals CK_t, CK_c, DQS_t, and DQS_c or transfers data read out from the data buffer DQB to the pad P. The clock signals CK_t and CK_c and the clock signals DQS_t and DQS_c are signals with the same frequency; however, these signals are not synchronized with each other.

Figure 2:
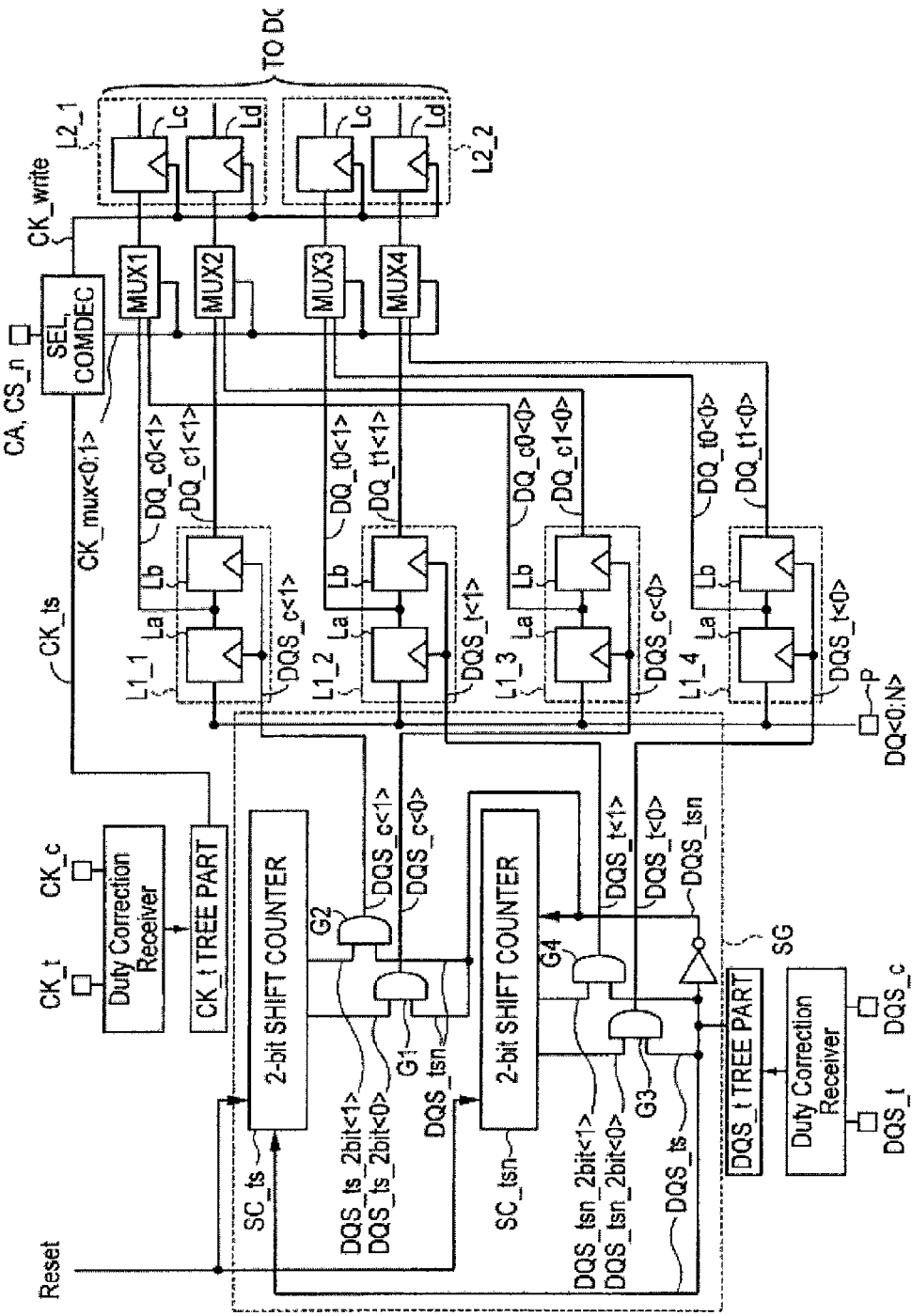
FIG. 2 is a block diagram showing the configuration of a write data input circuit in an I/O circuit of the semiconductor device of FIG. 1.

FIG. 2 is a block diagram showing the internal configuration of a write data input circuit of the I/O interface of the first embodiment. This data input circuit executes DDR transfer and switches the clock signal for controlling the timing of a flip-flop (first and second latch parts) from DQS_t to CK_t.

The write data input circuit of this embodiment is provided with latch circuits L1_1-L1_4 as the first latch part, latch circuits L2_1-L2_2 as the second latch part, strobe generation part SG, and multiplexers MUX1-MUX4.

The latch circuits L1_1-L1_4 latch write data received from the outside based on strobe signals DQS_t <0:1> and DQS_c <0:1> for permitting the latch of the write data. Here, <0:n> indicates any of <0>-<n>, where n is an integer.

Each of the latch circuits L1_1-L1_4 includes two first latch elements La and Lb connected in series. Therefore, each time the strobe signals DQS_t <0:1> and DQS_c <0:1> are activated twice, 2-bit data are transferred to the multiplexers MUX1-MUX4.

For example, if the strobe signal DQS_c <1> is activated, the latch La of the latch circuit L1_1 receives write data DQ <k> (k=0 to n) from the outside and latches the data. If the strobe signals DQS_c <1> are activated next, the data latched to the latch La of the latch circuit L1_1 are transferred to the latch Lb of the latch circuit L1_1, and the latch Lb latches the data. At that time, the latch La receives the next write data DQ <k+1> from the outside and latches the data.

Next, the data which are held by the latch La are output as the write data DQ_c0 <1> to the multiplexer MUX1. The data which are held by the latch Lb are output as the write data DQ_c1 <1> to the multiplexer MUX2. The latch circuit L1_1 continuously outputs the write data during the latch of the write data. Therefore, each time the strobe signal DQS_c <1> is activated twice, the latch circuit L1_1 can transfer 2-bit data to the multiplexers MUX1 and MUX2.

Similarly, each time the strobe signals DQS_t <1>, DQS_c <0>, and DQS_t <0> are activated twice, the latch circuits L1_2-L1-4 each latch 2-bit data and can transfer these data to any of the multiplexers MUX1-MUX4.

The multiplexers MUX1-MUX4 receive write data latched in the latch circuits L1_1-L1_4 based on clock signals CK_mux <0:1> and transfer the write data to the latch circuits L2_1 and L2_2. For example, the multiplexers MUX1 and MUX2 transfer the write data received from the latch circuit L1_1 to the latch circuit L2_1 based on the clock signals CK_mux <0:1>. In addition, the multiplexers MUX1 and MUX2 transfer the write data received from the latch circuit L1_3 to the latch circuit L2_1 based on the clock signals CK_mux <0:1>. Similarly, the multiplexers MUX3 and MUX4 transfer the write data received from the latch circuit L1_2 or L1_4 to the latch circuit L2_2 based on the clock signals CK_mux <0:1>. In this manner, the multiplexer MUX1 is connected between the latch circuits L1_1-L1_4 and the latch circuits L2_1 and L2_2 and selectively transfers the data from the latch circuits L1_1-L1_4 to the latch circuits L2_1 and L2_2.

The latch circuits L2_1 and L2_2 receive the write data transferred via the multiplexers MUX1-MUX4 from the latch circuits L1_1-L1_4 based on a first clock signal CK_write and latches the write data. The latch circuits L2_1 and L2_2 latch the write data and transfer the write data into the memory chip (for example, DQ buffer DQB).

The latch circuits L2_1 and L2_2 include two second latch elements Lc and Ld that write data that are output from the first latch elements La and Lb. Therefore, each latch circuit L2_1 and L2_2 simultaneously transfers 2-bit write data into the semiconductor device at the time of the rise or fall of the clock signal CK_write.

For example, when the clock signal CK_write is driven to logic high, the latch circuits L2_1 and L2_2 receive write data from the latch circuits L1_1 and L1_2 or the latch circuits L1_3 and L1_4 and latch the write data. The latch circuits L2_1 and L2_2 continuously output the write data during the latch of the write data. As such, the latch circuits L2_1 and L2_2 are operated at each timing of the rise of the clock signal CK_write, receive the write data from the latch circuits L1_1 and L1_2 or the latch circuits L1_3 and L1_4, and can simultaneously transfer the write data into the semiconductor device.

A selector SEL and a command decoder CMODEC receive a clock CK_ts and command CA and CS_n (write command or read command, etc.) and output clock signals CK_mux <0:1> to the multiplexers MUX1-MUX4 and CK_write to the latch circuits L2_1 and L2_2.

The clock signal CK_mux <0> is a signal that selects data DQ_t0 <0>, DQ_t1 <0>, DQ_c0 <0>, and DQ_c1 <0> which are latched in the latch circuits L1_3 and L1_4 to be supplied to the multiplexers MUX1-MUX4. If the clock signal CK_mux <0> is activated, the multiplexers MUX1-MUX4 transfer the data DQ_t0 <0>, DQ_t1 <0>, DQ_c0 <0>, and DQ_c1 <0> to the latch circuits L2_1 and L2_2. The clock signal CK_mux <1> is a signal that selects data DQ_t0 <1>, DQ_t1 <1>, DQ_c0 <1>, and DQ_c1 <1> which are latched in the latch circuits L1_1 and L1_2 to be supplied to the multiplexers MUX1-MUX4.

The first clock signal CK_write determines the data latch timing of the latch circuits L2_1 and L2_2. If the clock signal CK_mux <1> is activated, the multiplexers MUX1-MUX4 transfer the data DQ_t0 <1>, DQ_t1 <1>, DQ_c0 <1>, and DQ_c1 <1> to the latch circuits L2_1 and L2_2. Here, in this embodiment, the clock signals CK_mux <1> and CK_mux <0> are signals that are complementary to each other.

The strobe generation part SG generates the strobe signals DQS_t <0:1> and DQS_c <0:1> and supplies the strobe signals to the latch circuits L1_1-L1_4. The strobe generation part SG includes first and second bit shift counters SC_ts and SC_tsn and logic gate parts G1-G4.

In this embodiment, the first and second bit shift counters SC_ts and SC_tsn are each 2-bit shift counters. The first bit shift counter SC_ts receives the clock signal DQS_ts and outputs a bit shift signal DQS_ts_2bit <0:1>. The bit shift signal DQS_ts_2bit <0:1> is a signal whose logic is inverted at each certain period (for example, 2 clocks) of the clock signal DQS_ts. The second bit shift counter SC_tsn receives the clock signal DQS_tsn as an inverted signal of the clocks signal DQS_ts and outputs a bit shift signal DQS_tsn_2bit <0:1>. The bit shift signal DQS_tsn_2bit <0:1> is a signal whose logic is inverted at each certain period of the clock signal DQS_tsn.

The first bit shift counter SC_ts outputs two bit shift signals DQS_ts_2bit <0> and DQS_ts_2bit <1> that are complementary to each other. The second bit shift counter SC_tsn outputs two bit shift signals DQS_tsn_2bit <0> and DQS_tsn_2bit <1> that are complementary to each other. In other words, the first and second bit shift counters SC_ts and SC_tsn each output 2-bit signals. Here, the bit shift counter SC_tsn may be a well-known shift register.

For example, the bit shift signals DQS_ts_2bit <0:1> and DQS_tsn_2bit <0:1> are inverted from logic low to logic high when the clock signals DQS_ts and DQS_tsn rise the third time after rising twice. Next, the bit shift signals DQS_ts_2bit <0:1> and DQS_tsn_2bit <0:1> are inverted from logic high to logic low when the clock signals DQS_ts and DQS_tsn rise the third time after rising twice. With this repetition, the bit shift signals DQS_ts__2bit <0:1> and DQS_tsn__2bit <0:1> are controlled so that their logic is inverted for every two clocks of the clock signal DQS_ts and the clock signal DQS_tsn.

In this embodiment, logic gate parts G1-G4 (first logic gate parts G1 and G2 and second logic gate parts G3 and G4) are each AND gates. The AND gate G1 inputs the bit shift signal DQS_ts__2bit <0> from the first bit shift counter SC_ts and the second clock signal DQS_tsn and outputs the AND result as the strobe signal DQS_c <0>. The AND gate G2 inputs the bit shift signal DQS_ts__2bit <1> from the first bit shift counter SC_ts and the second clock signal DQS_tsn and outputs the AND result as the strobe signal DQS_c <1>. The AND gate G3 inputs the bit shift signal DQS_tsn__2bit <0> from the second bit shift counter SC_tsn and the second clock signal DQS_ts and outputs the AND result as the strobe signal DQS_t <0>. The AND gate G4 inputs the bit shift signal DQS_tsn__2bit <1> from the second bit shift counter SC_tsn and the second clock signal DQS_ts and outputs the AND result as the strobe signal DQS_t <1>. Therefore, the logic gates G1-G4 each output the second clock signal DQS_tsn or DQS_ts as the strobe signals DQS_c <0:1> and DQS_t <0:1> at each period of the bit shift signals DQS_ts__2bit <0:1> and DQS_tsn__2bit <0:1>.

For example, the logic gate G1 outputs the second clock signal DQS_tsn as the strobe signal DQS_c <0> at each period of the bit shift signal DQS_ts__2bit <0> during the period in which the bit shift signal DQS_ts__2bit <0> is activated. At that time, the bit shift signal DQS_ts__2bit <0> is activated for two periods of the second clock signal DQS_tsn. Therefore, the logic gate G1 outputs two clocks (two periods) of the second clock signal DQS_tsn as the strobe signal DQS_c <0> for one period of the bit shift signal DQS_ts__2bit <0>. Similarly, the logic gate G2 outputs two clocks of the second clock signal DQS_tsn as the strobe signal DQS_c <1> at each period of the bit shift signal DQS_ts__2bit <1> during the period in which the bit shift signal DQS_ts__2bit <1> is activated. The logic gate G3 outputs two clocks of the second clock signal DQS_ts as the strobe signal DQS_t <0> at each period of the bit shift signal DQS_tsn__2bit <0> during the period in which the bit shift signal DQS_tsn__2bit <0> is activated. The logic gate G4 outputs two clocks of the second clock signal DQS_ts as the strobe signal DQS_t <1> at each period of the bit shift signal DQS_tsn__2bit <1> during the period in which the bit shift signal DQS_tsn__2bit <1> is activated.

The clock signals CK_t and CK_c are supplied from the outside, and their duty is corrected via a pad by a duty correction part (e.g., duty correction receiver (DCR)). Next, only the clock signal CK_t is transmitted as the clock signal CK_ts via a CK_t tree part to the selector SEL and the command decoder CMODE.

The command decoder COMDEC generates the first clock CK_write from the clock signal CK_ts. For example, the command decoder COMDEC raises the first clock signal CK_write at every four periods of the clock signal CK_ts.

The clock signal CK_c is not used in this embodiment. Therefore, the shift of the clock signal CK_t and the clock signal CK_c has no influence on the operation of the I/O interface of this embodiment. In addition, with the use of only the clock signal CK_t, the consumed power can be reduced. Alternatively, instead of the clock signal CK_t, the clock signal CK_c may be used as the only clock signal.

The clock signals DQS_t and DQS_c are supplied from the outside, and their duty is corrected via a pad by duty correction (receiver duty correction (RDC)). Next, only the clock signal DQS_t is transmitted via a DQS_t tree part to the strobe generation part SG.

Therefore, the data input circuit of this embodiment uses only the tree part of the first clock signal CK_t and the tree part of the second clock signal DQS_t in the tree part. The data input circuit controls the second clock signal DQS_t through the combination of the first and second bit shift counters SC_ts and SC_tsn and controls the first latch circuits L1_1-L1_4 by the strobe signals DQS_t <0:1> and DQS_c <0:1> generated.

Figure 3:
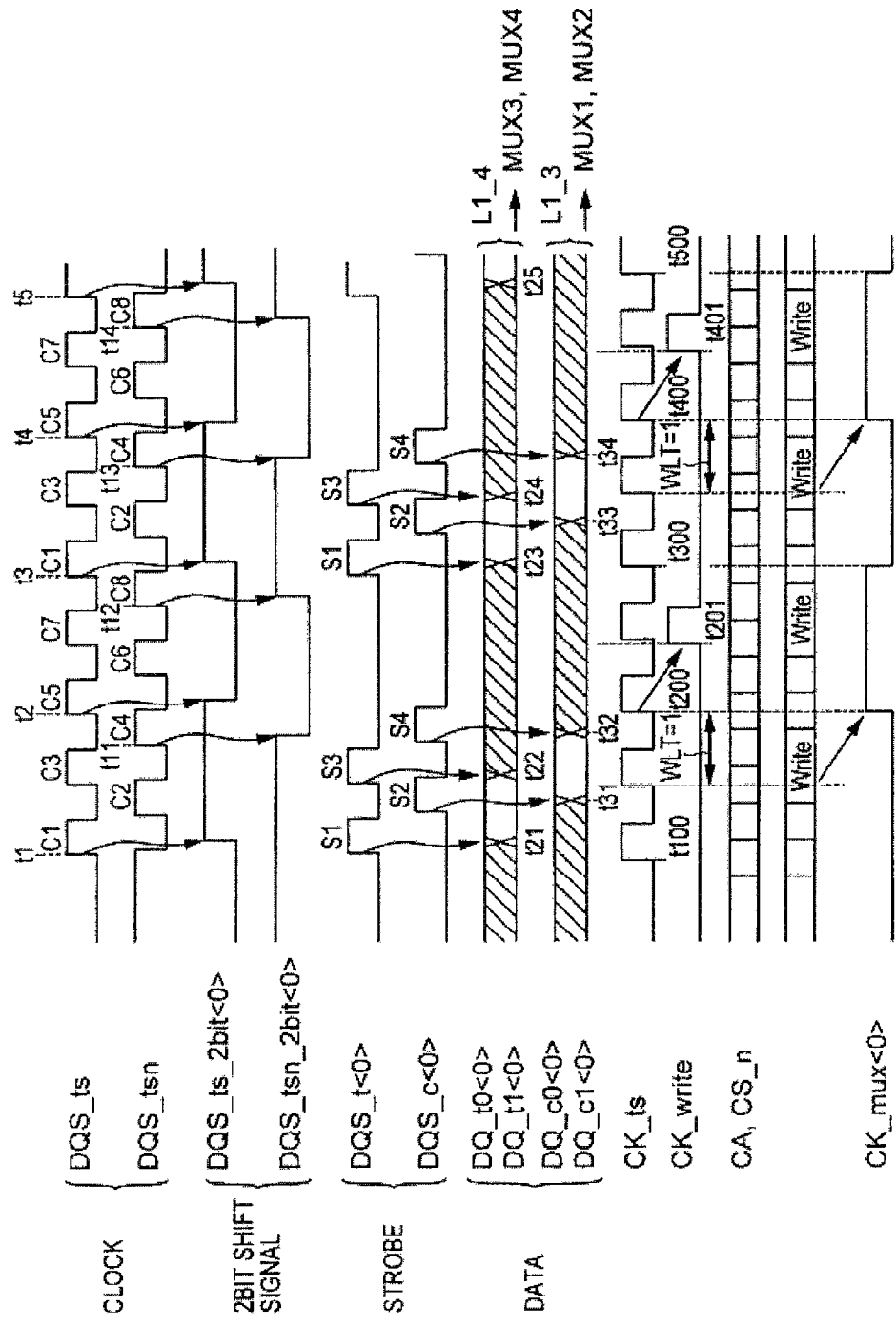
FIGS. 3 and 4 are timing charts showing an operation of the semiconductor storage device of the first embodiment.
Figure 4:
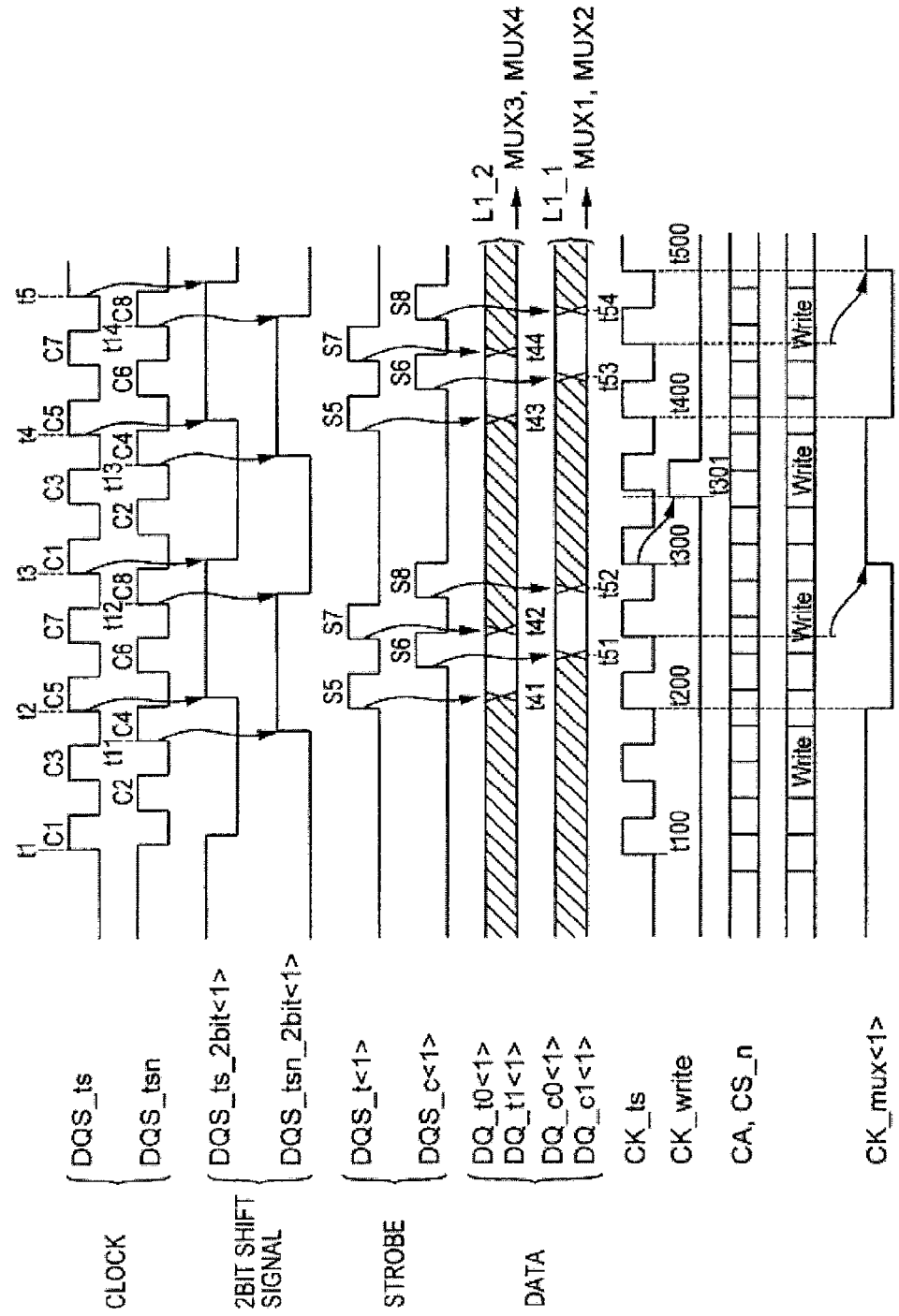

FIG. 3 and FIG. 4 are timing charts showing the operation of the semiconductor storage device of the first embodiment. With reference to FIG. 3 to FIG. 4, the operation of the semiconductor storage device will be explained. In this embodiment, the strobe generation part SG generates the strobe signals DQS_t <0:1> and DQS_c <0:1> by using the first clock CK_t and the second clock signal DQS_t without using the clock signals CK_c and DQS_c. Therefore, the shift of the clock signals CK_c and CK_t and the shift of the clock signals DQS_t and DQS_c do not cause a problem. In addition, since the strobe signals DQS_t <0:1> and DQS_c <0:1> are generated by using the first clock CK_t and the second clock signal DQS_t without using the clock signals CK_c and DQS_c, the consumed power in the tree part is reduced.

First, the second clock signal DQS_t is supplied to the strobe generation part SG via the duty correction part DCR and the tree part of DQS_t. The clock signal DQS_t passed through the tree part of DQS_t is assumed as the clock signal DQS_ts. The clock signal DQS_ts and its inverted signal DQS_tsn are respectively supplied to the first and second bit shift counters SC_ts and SC_tsn. Here, CLOCK shown in FIG. 3 to FIG. 4 represents the same clock signal DQS_t and DQS_tsn.

The first bit shift counter SC_ts, as shown in FIG. 3 to FIG. 4, controls the bit shift signals DQS_ts__2bit <0:1> so that the logic is inverted at every two clocks (two periods) of the second clock signal DQS_ts.

For example, the first bit shift counter SC_ts receives the rise of a clock C1 shown in FIG. 3 to FIG. 4, raises the bit shift signal DQS_ts__2bit <0>, and lowers the bit shift signal DQS_ts__2bit <1> (t1). Next, after receiving two clocks C1 and C3, the first bit shift counter SC_ts receives the rise of a clock C5, lowers the bit shift signal DQS_ts__2bit <0>, and raises the bit shift signal DQS_ts__2bit <1> (t2). Thereafter, the first bit shift counter SC_ts similarly raises or lowers the bit shift signals DQS_ts__2bit <0:1> for every two clocks of the second clock signal DQS_ts (t3-t5).

The second bit shift counter SC_tsn, as shown in FIG. 3 and FIG. 4, also controls the bit shift signals DQS_tsn__2bit <0:1> so that its logic is inverted for every two clocks (two periods) of the second clock signal DQS_tsn.

The second bit shift counter SC_tsn receives the rise of a clock C4 shown in FIG. 3 and FIG. 4, lowers the bit shift signal DQS_ts__2bit <0>, and raises the bit shift signal DQS_tsn__2bit <1> (t11). Next, after receiving two clocks C4 and C6, the second bit shift counter SC_tsn receives the rise of a clock C8, raises the bit shift signal DQS_tsn__2bit <0>, and lowers the bit shift signal DQS_tsn__2bit <1> (t12). Thereafter, the second bit shift counter SC_tsn similarly raises or lowers the bit shift signals DQS_tsn__2bit <0:1> for every two clocks of the second clock signal DQS_tsn (t13-t14).

Here, the bit shift counters SC_ts and SC_tsn may also raise or lower the bit shift signals DQS_ts__2bit <0:1> and DQS_tsn__2bit <0:1> for each j clocks (j represents an integer of 3 or greater).

When the bit shift signals DQS_ts_2bit <0:1> and DQS_tsn_2bit <0:1> are activated to logic high, the logic gate parts G1-G4 effectively pass the second clock DQS_tsn or DQS_ts. Next, the first logic gate parts G1 and G2 each output the clock signal DQS_tsn as the strobe signals DQS_c <0> and DQS_c <1>. The second logic gate parts G3 and G4 each output the clock signal DQS_ts as the strobe signals DQS_t <0> and DQS_t <1>.

For example, the logic gate part G1, as shown in FIG. 3, passes the clocks C2 and C4 at t1-t2, in which the bit shift signal DQS_ts_2bit <0> rises, and outputs the clocks C2 and C4 as strobe signals S2 and S4 to the latch circuit L1_3.

The logic gate part G2, as shown in FIG. 4, passes the clocks C6 and C8 at t2-t3, in which the bit shift signal DQS_ts_2bit <1> rises, and outputs the clocks C6 and C8 as strobe signals S6 and S8 to the latch circuit L1_1.

The logic gate part G3, as shown in FIG. 3, passes the clocks C1 and C3 for a period until t11, in which the bit shift signal DQS_tsn_2bit <0> rises, and outputs the clocks C1 and C3 as strobe signals S1 and S3 to the latch circuit L1_4.

The logic gate part G4, as shown in FIG. 4, passes the clocks C5 and C7 at t11-t12, in which the bit shift signal DQS_tsn_2bit <1> rises, and outputs the clocks C5 and C7 as strobe signals S5 and S7 to the latch circuit L1_2.

The latch circuits L1_1-L1_4 receive the strobe signals DQS_c <0:1> and DQS_t <0:1> (for example, S1-S8) and latch write data DQ <0:N> (for example, DQ <0>-DQ <7>) received from the outside of the chip.

Here, the bit shift signals DQS_ts_2bit <0> and DQS_tsn_2bit <0> are shifted by a half clock (half period) of the second clock signal DQS_ts or DQS_tsn. The reason for this is that the bit shift counters SC_ts and SC_tsn are operated by receiving the clock signals DQS_ts and DQS_tsn complementary to each other.

Therefore, even if the second clock signal DQS_tsn is slightly shifted from DQS_ts, if the shift is shorter than a half period of the second clock signal DQS_ts or DQS_tsn, the logic gate parts G1-G4 can precisely output the strobe signals S1-S8.

In addition, the strobe signals S1-S8 are output with a shift of each half clock of the second clock signal DQS_ts or DQS_tsn. In other words, the strobe signals S1-S8 are continuously output from the logic gate parts G1-G4 (t1-t3). Next, after the strobe signal S8 is output, the next strobe signals S1-S8 are continuously output to its previous strobe signal S8 (t3-t5). With its repetition, the latch circuits L1_1-L1_4 continuously receive the write data DQ <0:N> and can continuously latch the write data.

After receiving the strobe signal S1, the latch circuit L1_4 latches the write data DQ <0> in the latch element La (t21). At that time, the latch element La of the latch circuit L1_4 outputs the write data DQ <0> to the multiplexer MUX3, whereas the latch element Lb of the latch circuit L1_4 does not yet receive the write data (t21-t22).

Next, after receiving the strobe signal S2, the latch circuit L1_3 latches the write data DQ <1> in the latch element La (t31). At that time, the latch element La of the latch circuit L1_3 outputs the write data DQ <1> to the multiplexer, whereas the latch element Lb of the latch circuit L1_4 does not yet receive the write data (t31-t32).

Next, after receiving the strobe signal S3, the latch circuit L1_4 transfers the write data DQ <0> latched in the latch element La to the latch element Lb and latches the next write data DQ <2> in the latch element La (t22). Therefore, the latch elements La and Lb of the latch circuit L1_4 respectively latch the write data DQ <2> and DQ <0> and can output these 2-bit data DQ <2> and DQ <0> as write data DQ_t0 <0> and DQ_t1 <0> to the multiplexers MUX3 and MUX4.

Next, after receiving the strobe signal S4, the latch circuit L1_3 transfers the write data DQ <1> latched in the latch element La of the latch circuit L1_3 to the latch element Lb and latches the next write data DQ <3> in the latch element La (t32). Therefore, the latch elements La and Lb of the latch circuit L1_3 respectively latch the write data DQ <3> and DQ <1> and can output these 2-bit data DQ <3> and DQ <1> as write data DQ_c0 <0> and DQ_c1 <0> to the multiplexers MUX1 and MUX2.

During t21-t22 and t31-t32, since the first clock CK_write is not yet activated, the data of the latch circuits L1_3 and L1_4 are not yet transferred to the latch circuits L2_1 and L2_2.

After t1, if the selector SEL receives the write command Write as commands CA and CS_n, for example, after one clock of the clock signal CK_ts (assuming the write latency WLT=1), the clock signal CK_mux <0> is raised (t200). Therefore, the multiplexers MUX1-MUX4 select the latch circuits L1_3 and L1_4 and transfer the write data DQ <0>-DQ <3> latched in the latch circuits L1_3 and L1_4 to the latch circuits L2_1 and L2_2.

Next, after the clock of t200, if the command decoder COMDEC activates the first clock signal CK_write at t201, the latch circuits L2_1 and L2_2 latch the write data DQ <0>-DQ <3> of the latch circuits L1_3 and L1_4 selected in the multiplexers MUX1-MUX4 and transfer the data into the chip.

Similarly, after receiving the strobe signals S5 and S7 shown in FIG. 4, the latch circuit L1_2 latches the data DQ <6> and DQ <4> and can output these 2-bit data DQ <6> and DQ <4> as write data DQ_t0 <1> and DQ_t1 <1> to the multiplexers MUX3 and MUX4 (t41-t44).

After receiving the strobe signals S6 and S8, the latch circuit L1_1 latches the write data DQ <7> and DQ <5> and can output these 2-bit data DQ <7> and DQ <5> as write data DQ_c0 <1> and DQ_c1 <1> to the multiplexers MUX1 and MUX2 (t51-t54).

During t41-t42 and t51-t52, the clock signal CK_mux <1> is in an inactive state, and the multiplexers MUX1-MUX4 do not yet select the latch circuits L1_1 and L1_2. At that time, the clock signal CK_mux <0> is in an active state, and the multiplexers MUX1-MUX4 are in a state in which the latch circuits L1_3 and L1_4 are selected.

Next, after t2, if the selector SEL receives the write command Write as the commands CA and CS_n, for example, after one clock of the clock signal CK_ts (assuming the write latency WLT=1), the clock signal CK_mux <1> rises (t300). Therefore, the multiplexers MUX1-MUX4 select the latch circuits L1_1 and L1_2 and transfer the write data DQ <4>-DQ <7> latched in the latch circuits L1_1 and L1_2 to the latch circuits L2_1 and L2_2.

Next, after the clock of t300, if the command decoder COMDEC activates the first clock signal CK_write at t301, the latch circuits L2_1 and L2_2 latch the write data DQ <4>-DQ <7> of the latch circuits L1_1 and L1_2 selected in the multiplexers MUX1-MUX4 and transfer the data into the chip.

Here, the latch circuits L1_1-L1_4 continuously latch the 2-bit write data received at each period (first period) of the bit shift signals DQS_ts_2bit <0:1> and DQS_tsn_2bit <0:1> until the corresponding period of the bit shift signals DQS_ts_2bit <0:1> and DQS_tsn_2bit <0:1> is finished. In other words, the latch circuit L1_4 continues to latch until the input start of the next strobe signals S1 and S3 after the input of the strobe signals S1 and S3. The latch circuit L1_3 continues to latch until the input start of the next strobe signals S2 and S4 after the input of the strobe signals S2 and S4. The latch circuit L1_2 continues to latch until the input start of the next strobe signals S5 and S7 after the input of the strobe signals S5 and S7. In addition, the latch circuit L1_1 continues to latch until the input start of the next strobe signals S6 and S8 after the input of the strobe signals S6 and S8. In other words, the latch circuit L1_4 continuously outputs the write data DQ_t0 <0> and DQ_t1 <0> for the period of t22-t23 of FIG. 3. The latch circuit L1_3 continuously outputs the write data DQ_c0 <0> and DQ_c1 <0> for the period of t32-t33 of FIG. 3. The latch circuit L1_2 continuously outputs the write data DQ_t0 <1> and DQ_t1 <1> for the period of t42-t43 of FIG. 4. The latch circuit L1_1 continuously outputs the write data DQ_c0 <1> and DQ_c1 <1> for the period of t52-t53 of FIG. 4.

The latch circuits L2_1 and 2_2 may receive the first clock CK_write until the corresponding period (first period) of the bit shift signals DQS_ts_2bit <0:1> and DQS_tsn_2bit <0:1> is finished and may receive the write data latched in the first latch circuits L1_1-L1_4.

Therefore, even if the first clock signal CK_write rising at t201 is shifted in the range of t32-t23 by the shift of the clock signal CK_ts, the latch circuits L2_1 and L2_2 can precisely latch the data from the latch circuits L1_3 and L1_4. Similarly, even if the first clock signal CK_write rising at t401 is shifted in the range of t34-t25, the latch circuits L2_1 and L2_2 can precisely latch the data from the latch circuits L1_3 and L1_4. Even if the first clock signal CK_write rising at t301 of FIG. 4 is shifted in the range of t52-t43, the latch circuits L2_1 and L2_2 can precisely latch the data from the latch circuits L1_1 and L1_2.

Here, if the clock signal CK_ts is shifted from the clock DQS_ts, the clock signal CK_mux <0:1> is also similarly shifted along with the first clock signal CK_write. For this reason, the shift between the first clock CK_write and the clock signal CK_mux <0:1> may be ignored.

Therefore, in this embodiment, the latch period (for example, t44-t23, t32-t33, and t52-t43) of the write data in the first latch part (L1_1-L1_4) is determined by the period of the bit shift signals DQS_ts_2bit <0:1> and DQS_tsn_2bit <0:1> or the length of the period of the strobe signals. In addition, for the latch period of the write data in the first latch part (L1_1-L1_4), the first clock signal CK_write may be received. For example, the latch circuits L1_1 and L2_2 may receive the clock signal CL_write for the latch period (t32-t23) of the write data in the latch circuits L1_3 and L1_4. Alternatively, the latch circuits L1_1 and L2_2 may receive the clock signal CL_write for the latch period (t52-t43) of the write data in the latch circuits L1_1 and L1_2.

In this embodiment, since the period of the bit shift signals DQS_ts_2bit <0:1> and DQS_tsn_2bit <0:1> and the period of the strobe signals are as long as four clocks (four periods) of the second clock signal DQS_ts, these periods are longer than the latch period (for example, t32-t23, t34-t25, and t52-t43) of the write data in the first latch part (L1_1-L1_4). Therefore, even if there is a slight timing shift between the clock signal CK_ts (that is, the clock signal CK_write) and the second clock signal DQS_ts, the second latch part (L2_1 and L2_2) can receive the first clock signal CK_write for the latch period of the write data in the first latch part (L1_1-L1_4). In other words, the semiconductor storage device of this embodiment has a wide allowable range for the timing shift between the first clock signal CK_ts (that is, the clock signal CK_write) and the second clock signal DQS_ts, and can precisely transfer the write data into the chip.

Here, the write data latched in the second latch part (L2_1, L2_2) and the first latch part (L1_1-L1_4) are selectively output by 2 bits each (parallel). Therefore, in this embodiment, the write data can be DDR-transferred into the chip.

In the semiconductor storage device of this embodiment, even if the timing between the first clock signal CK_ts and the second clock signal DQS_ts is slightly shifted, the inferior data writes can be suppressed. By suppressing inferior data writes, a high-speed write operation can be realized and data can be transferred at high rates. In addition, in the semiconductor storage device of this embodiment, since only CK_t and DQS_t are used as clock signals, the consumed power of the tree part can be reduced.

Second Embodiment

Figure 5:
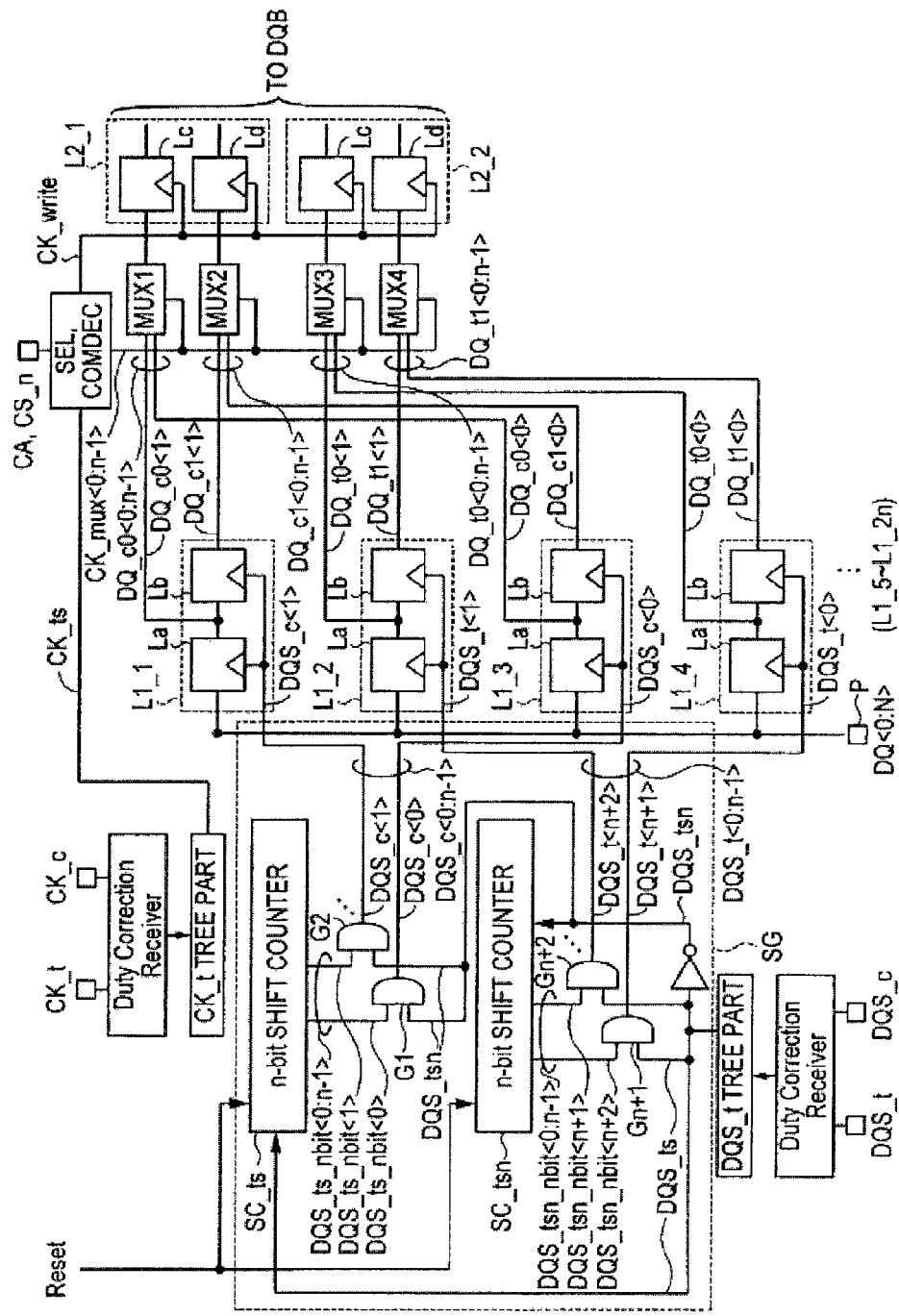
FIG. 5 is a block diagram showing the configuration of a write data input circuit of a semiconductor device according to a second embodiment.

FIG. 5 is a block diagram showing the internal constitution of a write data input circuit of an I/O part of a second embodiment. In the first embodiment, the strobe generation part SG is provided with the 2-bit shift counters SC_ts and SC_tsn. However, in the second embodiment, the strobe generation part SG is provided with n-bit shift counters (n represents an integer of 3 or greater) SC_ts and SC_tsn. In this case, for each bit shift counter SC_ts and SC_tsn, n pieces of logic gates G1-Gn and G(n+1)-G(2n) are respectively installed. In addition, a first latch part including 2n pieces of latch circuits L1_1-L1_2n is installed in accordance with 2n pieces of logic gates G1-Gn and G(n+1)-G(2n).

The multiplexers MUX1-MUX4 receive data from the latch circuits L1_1-L1_2n and selectively transfer 4-bit data among the data to the latch circuits L2_1 and L2_2. The number of multiplexers MUX1-MUX4 and the number of latch circuits L2_1 and L2_2 are respectively the same as those of the first embodiment.

The n-bit shift counters SC_ts and SC_tsn output any of bit shift signals DQS_ts_nbit <0:n−1> and any of DQS_tsn_nbit <0:n−1> signals at each designated period (for example, two clocks) of the clock signal DQS_ts or DQS_tsn. For example, the n-bit shift counters SC_ts and SC_tsn respectively activate the bit shift signals DQS_ts_nbit <0> and DQS_tsn_nbit <0> for a certain period of the clock signal DQS_ts or DQS_tsn, activates the bit shift signals DQS_ts_nbit <1> and DQS_tsn_nbit <1> for the next period, and activates the bit shift signals DQS_ts_nbit <2> and DQS_tsn_nbit <2> for the next period. In this manner, the n-bit shift counters SC_ts and SC_tsn activate the bit shift signals DQS_ts_nbit <0:n−1> and DQS_tsn_nbit <0:n−1> in the order of the numerical value in < >. Along with that, the strobe generation part SG outputs strobe signals DQS_c <0:n−1> and DQS_t <0:n−1> in the order of the numerical value in < >.

The multiplexers MUX1-MUX4 receive data from the latch circuits L1_1-L1_2n and selectively transfer 4-bit data among the data to the latch circuits to the latch circuits L2_1 and L2_2. For example, the multiplexers MUX1-MUX4 respectively receive DQ_c0 <0:n−1>, DQ_c1 <0:n−1>, DQ_t0 <0:n−1>, and DQ_t1 <0:n−1> and transfer these data to the latch circuits L2_1 and L2_2 in the order of the numerical value in < >. The data DQ_c0 <k>, DQ_c1 <k>, DQ_t0 <k>, and DQ_t1 <k> (k=0~n−1) with the same numerical value in < > are simultaneously transferred.

The other constitutions of the second embodiment may be similar to the constitutions of the first embodiment.

Figure 6:
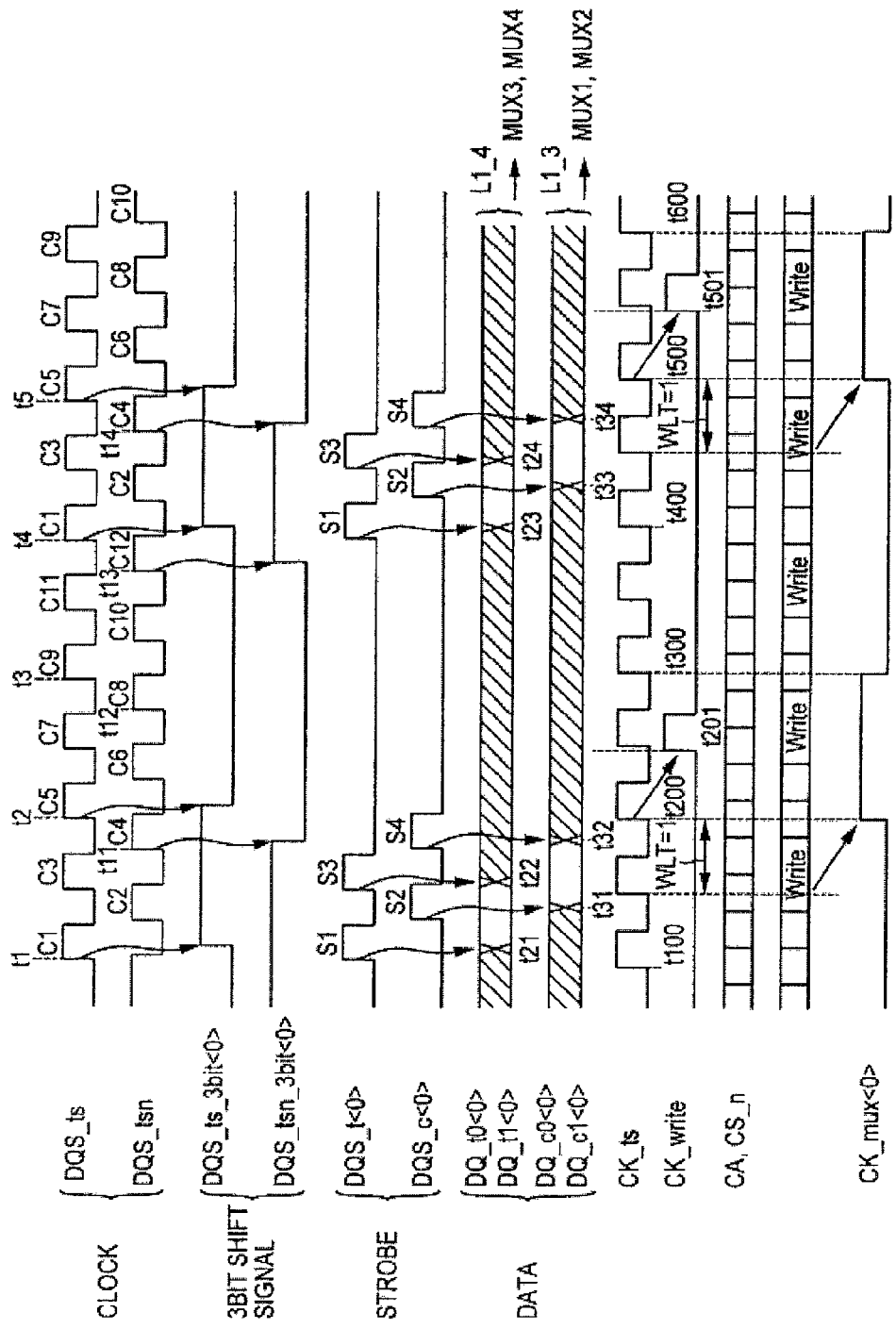
FIGS. 6, 7, and 8 are timing charts showing an operation of the semiconductor storage device of the second embodiment.
Figure 7:
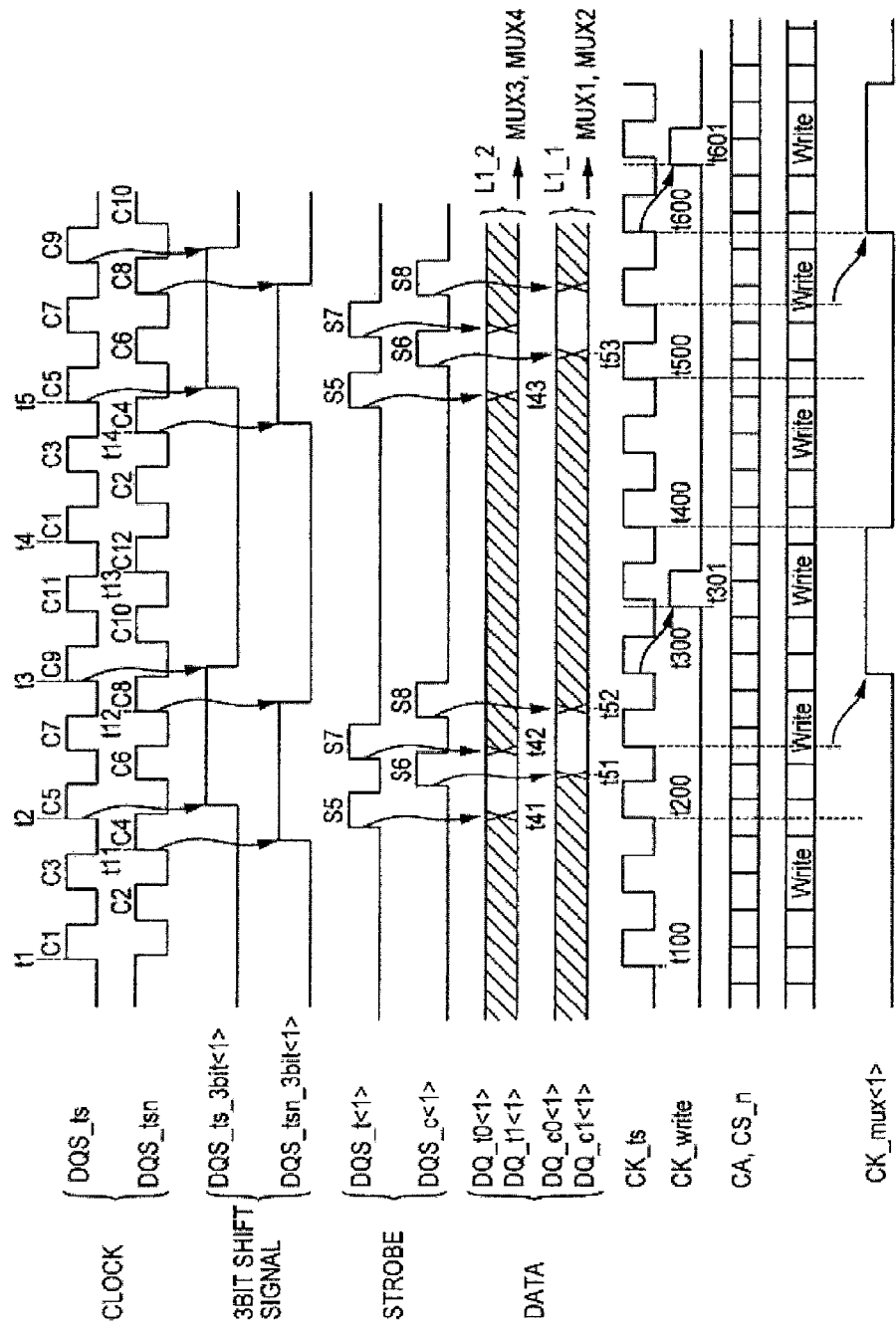
Figure 8:
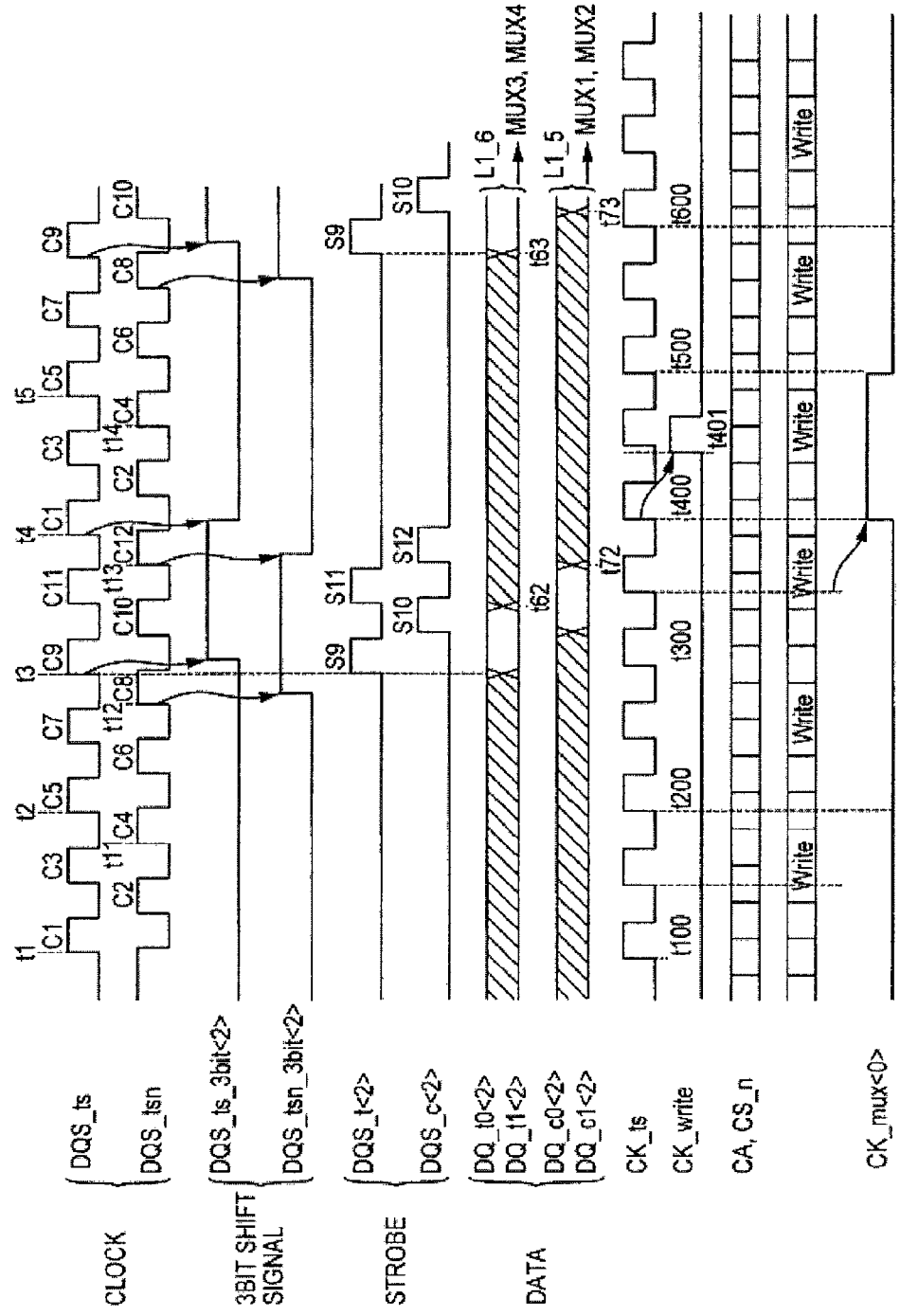

FIG. 6 TO FIG. 8 are timing charts showing the operation of MRAM of the second embodiment. In FIG. 6 TO FIG. 8, an example of MRAM provided with 3-bit shift counters SC_ts and SC_tsn is shown.

The clock signals DQS_ts and DQS_tsn are the same as those of the first embodiment. The 3-bit shift counter SC_ts periodically (for example, every two clocks), and sequentially activates 3-bit shift signals DQS_ts_3bit <0>-DQS_ts_3bit <2>. The 3-bit shift counter SC_tsn periodically and sequentially activates 3-bit shift signals DQS_tsn_3bit <0>-DQS_tsn_3bit <2>. For example, the 3-bit shift signal DQS_ts_3bit <0> is activated at t1-t2 (FIG. 6), the 3-bit shift signal DQS_ts_3bit <1> is activated at t2-t3 (FIG. 7), and the 3-bit shift signal DQS_ts_3bit <2> is activated at t3-t4 (FIG. 8). Thereafter, the activation of the 3-bit shift signal DQS_ts_3bit <0:2> is repeated.

The 3-bit shift signal DQS_tsn_3bit <0> is activated until t11 (FIG. 6), the 3-bit shift signal DQS_ts_3bit <1> is activated at t11-t12 (FIG. 7), and the 3-bit shift signal DQS_ts_3bit <2> is activated at t12-t13 (FIG. 8). Thereafter, the activation of the 3-bit shift signal DQS_tsn_3bit <0:2> is repeated.

The logic gate G1, as shown in FIG. 6, passes clocks C2 and C4 at t1-t2, in which the bit shift signal DQS_ts_3bit <0> rises, and outputs the clocks C2 and C4 as strobe signals S2 and S4 to the latch circuit L1_3.

The logic gate part G2, as shown in FIG. 7, passes clocks C6 and C8 at t2-t3, in which the bit shift signal DQS_ts_3bit <1> rises, and outputs the clocks C6 and C8 as strobe signals S6 and S8 to the latch circuit L1_1.

The logic gate part G3 (not shown in the figure), as shown in FIG. 8, passes clocks C10 and C12 for a period of t3-t4, in which the bit shift signal DQS_ts_23bit <2> rises, and outputs the clocks C10 and C12 as strobe signals S10 and S12 to the latch circuit L1_5 (not shown in the figure).

The logic gate part Gn+1, as shown in FIG. 6, passes clocks C1 and C3 for a period until t11, in which the bit shift signal DQS_tsn_3bit <0> rises, and outputs the clocks C1 and C3 as strobe signals S1 and S3 to the latch circuit L1_2.

The logic gate part Gn+2, as shown in FIG. 7, passes clocks C5 and C7 at t11-t12, in which the bit shift signal DQS_tsn_3bit <1> rises, and outputs the clocks C5 and C7 as strobe signals S5 and S7 to the latch circuit L1_2.

The logic gate part Gn+3 (not shown in the figure), as shown in FIG. 8, passes clocks C9 and C11 at t12-t13, in which the bit shift signal DQS_tsn_3bit <2> rises, and outputs the clocks C9 and C11 as strobe signals S9 and S11 to the latch circuit L1_6.

The latch circuits L1_1-L1_6 receive the strobe signals DQS_t <0:2> and DQS_c <0:2> (for example, S1-S12) and latch write data DQ <0:N> (for example, DQ_t <0:2>-DQ_t <0:2>) received from the outside of the chip.

After t1, if the selector SEL receives a write command Write as commands CA and CS_n, for example, after one clock of the clock signal CK_ts (assuming the write latency WLT=1), the clock signal CK_mux <0> is raised (t200). Therefore, the multiplexers MUX1-MUX4 select the latch circuits L1_3 and L1_4 and transfer the write data DQ_t0 <0>, DQ_t1 <0>, DQ_c0 <0>, and DQ_c1 <0> latched in the latch circuits L1_3 and L1_4 to the latch circuits L2_1 and L2_2.

Next, after the clock of t200, if the command decoder COMDEC activates the first clock signal CK_write at t201, the latch circuits L2_1 and L2_2 latch the write data DQ_t0 <0>, DQ_t1 <0>, DQ_c0 <0>, and DQ_c1 <0> of the latch circuits L1_3 and L1_4 selected in the multiplexers MUX1-MUX4 and transfer the data into the chip.

After t2, if the selector SEL receives the write command Write as the commands CA and CS_n, for example, after one clock of the clock signal CK_ts, the clock signal CK_mux <1> rises (t300 of FIG. 7). Therefore, the multiplexers MUX1-MUX4 select the latch circuits L1_1 and L1_2 and transfer the write data DQ_t0 <1>, DQ_t1 <1>, DQ_c0 <1>, and DQ_c1 <1> latched in the latch circuits L1_1 and L1_2 to the latch circuits L2_1 and L2_2.

Next, after the clock of t300, if the command decoder COMDEC activates the first clock signal CK_write at t301, the latch circuits L2_1 and L2_2 latch the write data DQ_t0 <1>, DQ_t1 <1>, DQ_c0 <1>, and DQ_c1 <1> of the latch circuits L1_1 and L1_2 selected in the multiplexers MUX1-MUX4 and transfer the data into the chip.

After t3, if the selector SEL receives the write command Write as the commands CA and CS_n, for example, after one clock of the clock signal CK_ts, the clock signal CK_mux <2> rises (t400 of FIG. 8). Therefore, the multiplexers MUX1-MUX4 select the latch circuits L1_5 and L1_6 and transfer the write data DQ_t0 <2>, DQ_t1 <2>, DQ_c0 <2>, and DQ_c1 <2> latched in the latch circuits L1_5 and L1_6 to the latch circuits L2_1 and L2_2.

Next, after the clock of t400, if the command decoder COMDEC activates the first clock signal CK_write at t401, the latch circuits L2_1 and L2_2 latch the write data DQ_t0 <2>, DQ_t1 <2>, DQ_c0 <2>, and DQ_c1 <2> of the latch circuits L1_1 and L1_2 selected in the multiplexers MUX1-MUX4 and transfer the data into the chip.

Here, the latch circuits L1_1-L1_4 continuously latch the 2-bit write data received at each period (first period) of the bit shift signals DQS_ts_2bit <0:2> and DQS_tsn_2bit <0:2> until the corresponding period of the bit shift signals DQS_ts_2bit <0:2> and DQS_tsn_2bit <0:2> is finished. In other words, the latch circuit L1_4 continues to latch until the input start of the next strobe signals S1 and S3 after the input end of the strobe signals S1 and S3. The latch circuit L1_3 continues to latch until the input start of the next strobe signals S2 and S4 after the input end of the strobe signals S2 and S4. The latch circuit L1_2 continues to latch until the input start of the next strobe signals S5 and S7 after the input end of the strobe signals S5 and S7. In addition, the latch circuit L1_1 continues to latch until the input start of the next strobe signals S6 and S8 after the input end of the strobe signals S6 and S8. The latch circuit L1_5 continues to latch until the input start of the next strobe signals S9 and S11 after the input end of the strobe signals S9 and S11. The latch circuit L1_6 continues to latch until the input start of the next strobe signals S10 and S12 after the input end of the strobe signals S10 and S12. For example, the latch circuit L1_4 continuously outputs the write data DQ_t0 <0> and DQ_t1 <0> for the period of t22-t23 of FIG. 6. The latch circuit L1_3 continuously outputs the write data DQ_c0 <0> and DQ_c1 <0> for the period of t32-t33. The latch circuit L1_2 continuously outputs the write data DQ_t0 <1> and DQ_t1 <1> for the period of t42-t43 of FIG. 7. The latch circuit L1_1 continuously outputs the write data DQ_c0 <1> and DQ_c1 <1> for the period of t52-t53. The latch circuit L1_5 continuously outputs the write data DQ_t0 <2> and DQ_t1 <2> for the period of t62-t63 of FIG. 8. The latch circuit L1_6 continuously outputs the write data DQ_c0 <2> and DQ_c1 <2> for the period of t72-t73.

The latch circuits L2_1 and 2_2 may receive the first clock CK_write until the corresponding period (first period) of the bit shift signals DQS_ts_3bit <0:2> and DQS_tsn_3bit <0:2> is finished and may receive the write data latched in the first latch circuits L1_1-L1_4.

Therefore, the MRAM of the second embodiment can also obtain effects similar to those of the first embodiment.

The second embodiment is an embodiment using the 3-bit shift counters; however, with reference to this embodiment, an embodiment using n-bit shift counters can be easily generalized.

Here, the n-bit shift counters in the embodiment may also be set when a data write mode and a data readout mode are switched. The n-bit shift counters have a reset function of resetting the internal logic state from the data readout mode to the data write mode.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a first latch unit configured to latch write data based on a strobe signal;
    a second latch unit configured to receive the write data latched in the first latch unit based on a first clock signal; and
    a strobe generation unit configured to generate the strobe signal and supply the strobe signal to the first latch unit, the strobe generation unit including a bit shift counter configured to receive a second clock signal and output a bit shift signal having a logic level that is inverted every n clock cycles of the second clock signal, where n is an integer and 2 or more, and a logic gate configured to output the second clock signal as the strobe signal according to a logic level of the bit shift signal,
    wherein a latch period of the write data in the first latch unit is determined by a period of the strobe signal.

2. The semiconductor device according to claim 1, wherein the latch period of the write data in the first latch unit is also determined by the period of a bit shift signal.

3. The semiconductor device according to claim 2, wherein the logic gate is configured to output the second clock signal as the strobe signal when the logic level of the bit shift signal is at a high level.

4. The semiconductor device according to claim 2, wherein the first latch unit continuously latches the write data until end of the period of the bit shift signal, and the second latch unit receives the write data latched in the first latch unit during the period of the bit shift signal.

5. The semiconductor device according to claim 2, wherein the first latch unit latches the write data for a period of time that begins with a certain strobe signal and ends with a next strobe signal, the second latch unit receives the write data latched in the first latch unit during the period of time.

6. The semiconductor device according to claim 1, wherein the bit shift counter has a reset function for resetting the internal logic state from a data readout mode to the data write mode.

7. The semiconductor device according to claim 1, wherein the generated strobe signals are shifted by a half period of the second clock signal.

8. The semiconductor device according to claim 1, wherein the first latch unit includes a plurality of latch groups, each latch group including serially connected first and second latches, the first latch connected to a pad to receive the write data from an external source and the second latch connected to receive the write data from the first latch.

9. The semiconductor device according to claim 8, wherein the second latch unit includes a plurality of latches, each connected to a pad to transfer the write data to a buffer.

10. A semiconductor device, comprising:
    a first latch unit configured to latch write data based on a strobe signal;
    a second latch unit configured to receive the write data latched in the first latch unit based on a first clock signal; and
    a strobe generation unit configured to generate the strobe signal and supply the strobe signal to the first latch unit, the strobe generation unit including a first bit shift counter configured to receive the second clock signal and output a first bit shift signal having a logic level that is inverted every plural clock cycles of the second clock signal, a second bit shift counter configured to receive an inverting signal of the second clock signal and output a second bit shift signal having a logic level that is inverted every plural clock cycles of an inverted second clock signal, a first logic gate configured to output an AND arithmetic result of the first bit shift signal and the inverted second clock signal as a first strobe signal, and a second logic gate configured to output an AND arithmetic result of the second bit shift signal and the second clock signal as a second strobe signal.

11. The semiconductor device according to claim 10, wherein the first strobe signal and the second strobe signal are shifted by a half period of the second clock signal.

12. The semiconductor device according to claim 11, wherein the strobe generation unit further includes a third logic gate configured to output an AND arithmetic result of an inverted second bit shift signal and the inverted second clock signal as a third strobe signal, and a fourth logic gate configured to output an AND arithmetic result of an inverted first bit shift signal and the second clock signal as a fourth strobe signal,
    wherein the first to fourth strobe signals are shifted by a half period of the second clock signal.

13. The semiconductor device according to claim 12, wherein
    the first latch unit is configured to continuously latches the write data for a part of a period of the bit shift signal until the end of the period; and
    the second latch unit receives the write data latched in the first latch unit during the part of the period.

14. The semiconductor device according to claim 12, wherein the first latch unit latches the write data received for a period of time that begins with a certain strobe signal and ends with a next strobe signal, and the second latch unit receives the write data latched in the first latch unit during the period of time.

15. The semiconductor device according to claim 12, wherein each bit shift counter has a reset function for resetting the internal logic state from a data readout mode to the data write mode.

16. The semiconductor device according to claim 10, wherein the first latch unit includes a plurality of latch groups, each latch group including serially connected first and second latches, the first latch connected to a pad to receive the write data from an external source and the second latch connected to receive the write data from the first latch.

17. The semiconductor device according to claim 16, wherein the second latch unit includes a plurality of latches, each connected to a pad to transfer the write data to a buffer.

18. A method for driving a semiconductor device including a first latch unit that latches write data based on a strobe signal, a second latch unit that receives the write data latched in the first latch part based on a first clock signal, and a strobe generation unit that generates the strobe signal and supplies the strobe signal to the first latch unit, the method comprising the steps of:
   generating a bit shift signal having a logic level that is inverted every plural clock cycles of a second clock signal;
   outputting the second clock signal as the strobe signal according to a logic level of the bit shift signal; and
   latching the write data in the first latch unit for at least a period of time that begins with a first strobe and ends with a second strobe,
   wherein the first and second strobes are consecutive strobes of the strobe signal and define a time interval therebetween that is larger than a period of the second clock signal but less than a period of the bit shift signal.

19. The method of claim 18, further comprising:
   latching the write data in the second latch unit during the period of time the write data is latched in the first latch unit.

20. The method of claim 18, wherein said outputting the second clock signal as the strobe signal includes:
   inputting the bit shift signal and the second clock signal into an AND gate to produce the strobe signal.

* * * * *